(12) United States Patent
Kim

(10) Patent No.: US 6,356,504 B1
(45) Date of Patent: Mar. 12, 2002

(54) ADDRESS GENERATING AND DECODING CIRCUIT FOR USE IN A BURST-TYPE AND HIGH-SPEED RANDOM ACCESS MEMORY DEVICE WHICH HAS A SINGLE DATA RATE AND A DOUBLE DATA RATE SCHEME

(75) Inventor: Eun-Cheol Kim, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/653,442

(22) Filed: Sep. 1, 2000

(30) Foreign Application Priority Data

Sep. 2, 1999 (KR) .............................. 99-37153

(51) Int. Cl.[7] ................................................ G11C 8/00
(52) U.S. Cl. .............. 365/230.06; 365/239; 365/230.09
(58) Field of Search ....................... 365/230.06, 230.03, 365/230.07, 230.09, 230.01, 233, 239, 238.5

(56) References Cited

U.S. PATENT DOCUMENTS

| | | | | |
|---|---|---|---|---|
| 5,452,261 A | | 9/1995 | Chung et al. ................. | 365/233 |
| 5,596,616 A | | 1/1997 | Jeang .......................... | 377/56 |
| 5,708,688 A | | 1/1998 | Ting et al. .................... | 377/33 |
| 6,118,726 A | * | 9/2000 | Ji et al. ................... | 365/230.06 |
| 6,172,893 B1 | * | 1/2001 | Ryan ........................... | 365/49 |

* cited by examiner

Primary Examiner—David Nelms
Assistant Examiner—Thong Le
(74) Attorney, Agent, or Firm—Marger Johnson & McCollom, P.C.

(57) ABSTRACT

A burst-type random access memory device according to the present invention includes an address generator that receives an initial address to generate a sequence of burst addresses according to either one of a single data rate mode and a double data rate mode. A decoding circuit decodes the burst address thus generated. Therefore, in the memory device are automatically generated a sequence of burst addresses necessary for a sequential/interleaved burst operation of the single data rate mode and the double data rate mode.

30 Claims, 9 Drawing Sheets

Fig. 9A

| External Address (XA1, XA0) | First Period (B1, B0) | Second Period (B1,B0) | Third Period (B1,B0) | Fourth Period (B1,B0) |
|---|---|---|---|---|
| 00 | 00 | 01 | 10 | 11 |
| 01 | 01 | 00 | 11 | 10 |
| 10 | 10 | 11 | 00 | 01 |
| 11 | 11 | 10 | 01 | 00 |

Fig. 9B

| External Address (XA1, XA0) | First Period (B1, B0) | Second Period (B1,B0) | Third Period (B1,B0) | Fourth Period (B1,B0) |
|---|---|---|---|---|
| 00 | 00 | 01 | 10 | 11 |
| 01 | 01 | 10 | 11 | 00 |
| 10 | 10 | 11 | 00 | 01 |
| 11 | 11 | 00 | 01 | 10 |

Fig. 9C

| DDR Sequential Burst Mode | | | | | DDR Interleaved Burst Mode | | | | |
|---|---|---|---|---|---|---|---|---|---|
| External Address (XA1, XA0) | First Period | | Second Period | | External Address (XA1, XA0) | First Period | | Second Period | |
| | B1B0 | $D_i$ / $D_j$ | B1B0 | $D_i$ / $D_j$ | | B1B0 | $D_i$ / $D_j$ | B1B0 | $D_i$ / $D_j$ |
| 00 | 00 | $D_0$ / $D_1$ | 10 | $D_2$ / $D_3$ | 00 | 00 | $D_0$ / $D_1$ | 10 | $D_2$ / $D_3$ |
| 01 | 01 | $D_1$ / $D_2$ | 11 | $D_3$ / $D_0$ | 01 | 01 | $D_1$ / $D_0$ | 11 | $D_3$ / $D_2$ |
| 10 | 10 | $D_2$ / $D_3$ | 00 | $D_0$ / $D_1$ | 10 | 10 | $D_2$ / $D_3$ | 00 | $D_0$ / $D_1$ |
| 11 | 11 | $D_3$ / $D_0$ | 01 | $D_1$ / $D_2$ | 11 | 11 | $D_3$ / $D_2$ | 01 | $D_1$ / $D_0$ |

Fig. 9D

| | Single Data Rate Mode | | Double Data Rate Mode | |
|---|---|---|---|---|
| | Sequential | Interleaved | Sequential | Interleaved |
| MODE | LOW | HIGH | LOW | HIGH |
| $\overline{DDR}$ | HIGH | HIGH | LOW | LOW |

ADDRESS GENERATING AND DECODING CIRCUIT FOR USE IN A BURST-TYPE AND HIGH-SPEED RANDOM ACCESS MEMORY DEVICE WHICH HAS A SINGLE DATA RATE AND A DOUBLE DATA RATE SCHEME

This application relies from priority upon Korean Patent Application No. 1999-37153, filed on Sep. 2, 1999, the contents of which are herein incorporated by reference in their entirety.

FIELD OF THE INVENTION

The present invention is related to a random access memory device, and specifically to an address generating and decoding circuit realized to a burst-type and high-speed random access memory device, which has a single data rate and double data rate scheme.

BACKGROUND OF THE INVENTION

Video RAM (random access memory), synchronous RAM and burst RAM each require a sequence of internally generated addresses (referred to as "an address burst", "an address sequence" or "a serial address") to support a high-speed data access operation. Typically the start address of a particular address burst is provided from an external source (e.g. a host computer or a processor), and as subsequent clock signals arrive at the address generator, the following addresses in the burst are sequentially generated for the duration of the burst.

Techniques associated with the address generator for performing such a function are disclosed in U.S. Pat. Nos. 5,596,616, 5,708,688, and 5,452,261. These patents utilize a single data rate (SDR) scheme, in which a data element is inputted/outputted to/from a burst-type RAM during a cycle of a system clock. As the above-described burst mode is provided to a random access memory, a data access operation of the memory is possible. Nevertheless, a user requires gradually requires more rapid data access operation.

Among techniques for speeding up the data access operation, one is a double data rate (DDR) scheme, in which at least two data are inputted/outputted to/from a memory device during one cycle of a system clock. An operation speed (or performance) of the RAM incorporating the DDR scheme is thus doubled to one using the SDR scheme. In order to input/output two data elements during one cycle of the system clock, addresses are required in a first logic state (e.g., a low level) period of the system clock, and in a second logic state (e.g., a high level) period thereof, respectively. Therefore, unlike the from address generators of the above-mentioned patents only used at the SDR mode, a new address generator is required which is capable of being used at both the SDR mode and the DDR mode.

SUMMARY OF THE INVENTION

It is therefore an object of the invention to provide an address generating and decoding circuit suitable for a burst-type random access memory device supporting both a single data rate mode and a double data rate mode.

This and other objects, advantages and features of the present invention are provided by the invention. An address generating and decoding circuit for use in a burst-type random access memory device has a single data rate (SDR) mode, in which only one data clement is inputted/outputted in/from the memory device during a system clock cycle, and a double data rate (DDR) mode, in which two data elements are inputted/outputted in/from during the system clock cycle.

The address generating and decoding circuit of the invention comprises an address generator for producing a sequence of burst addresses. It produces them in response to an initial address which is a part of an externally applied address, a first control signal indicative of a burst type, and a second control signal indicative of either the DDR mode or the SDR mode. The first burst addresses of the sequence are synchronized with first and second clock signals. The circuit also includes decoding means for sequentially receiving the burst addresses to decode a first burst address thus received and the remaining address of the externally applied address.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings, in which like reference symbols indicate the same or similar components, wherein:

FIGS. 9A, 9B, 9C, 9D are tables showing operations and values for a relationship between an initial address and a sequence of burst addresses according to burst operations of a single data rate mode and a double data rate mode.

DESCRIPTION OF THE PREFERRED EMBODIMENT

The preferred embodiment of the invention is now more fully described with reference to the attached drawings.

A burst-type random access memory device, for example, a synchronous static RAM (hereinafter, referred to as "SRAM") has a sequential burst mode (or a linear burst mode) and an interleaved burst mode. Furthermore, the SRAM device operates at a single data rate (SDR) mode, and at a double data rate (DDR) mode. Tables showing the relationship between an initial address and a sequence of burst addresses according to a burst operation of SDR/DDR mode are illustrated in FIGS. 9A–9D.

In the SDR mode, a data element, also known as datum, is inputted/outputted to/from the SRAM device during one cycle of a system clock. In the DDR mode, two data are inputted/outputted to/from the SRAM device during one cycle of the system clock. For example, one datum is inputted/outputted to/from the SRAM device during a first logic state of the system clock, and the other datum is inputted/outputted to/from the SRAM device during a second logic state of the system clock. Therefore, a burst-type SRAM device requires an address generating circuit for generating a sequence of burst addresses needed when the SRAM device operates at the SDR mode, and also when it operates at the DDR mode.

Figure 1:
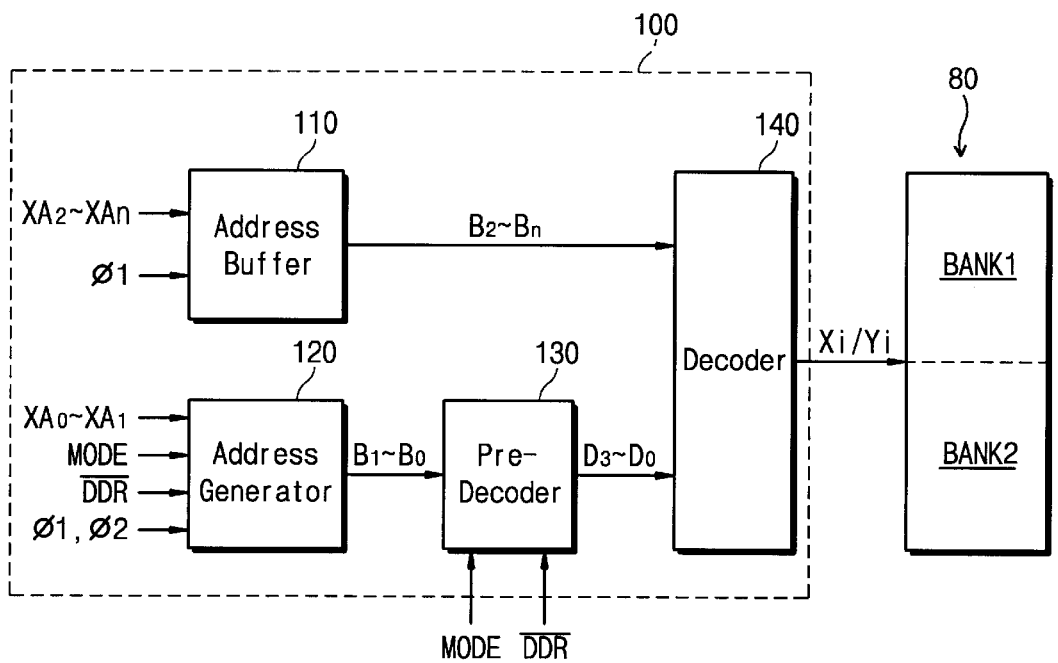
FIG. 1 shows a block diagram of an address generating and decoding circuit according to the present invention.

In FIG. 1, a block diagram of a random access memory device is illustrated. It includes memory cells 80 arranged in two banks BANK 1 and BANK 2, and an address generating and decoding circuit 100 capable of being applied to the memory cells of the above-described burst-type SRAM device. Hereinafter, the present invention will be described using the burst-type SRAM device for performing a 4-burst operation. This means that an initial address is a two-bit address. However, it is obvious that the present invention can be applied to a random access memory device whose burst length is more than 4.

Referring to FIG. 1, the address generating and decoding circuit 100 according to the present invention comprises an address buffer 110, an address generator (an address sequencer or a burst address sequence generator) 120, a pre-decoder 130 and a decoder 140.

The address buffer 110 receives address bit signals XA2–XAn of an externally applied multi-bit address XA0–XAn (n is an integer). These are all remaining except for the initial address bit signals XA0 and XA1. In some cases, the address buffer 110 can receive all of the address bit signals XA0–XAn.

The address generator 120 is driven by a first clock signal $\phi 1$ and a second clock signal $\phi 2$, and receives the initial address bit signals XA0 and XA1. And then, the address generator 120 generates a sequence of burst addresses 'B1B0', illustrated in FIGS. 9A–9D, according to control signals MODE and $\overline{\text{DDR}}$. The control signal MODE indicates a sequential mode or an interleaved mode, and the control signal $\overline{\text{DDR}}$ indicates the SDR mode or the DDR mode. An operation of the address generator 120 will be more fully described below.

The burst address 'B1B0' thus generated is transferred to the pre-decoder 130. The pre-decoder 130 decodes the burst address 'B1B0' from the address generator 120 according to the control signals MODE and $\overline{\text{DDR}}$.

In the case that a random access memory device performs a burst operation of the SDR mode, there is activated only one of decoded signals D3–D0 generated as a result of decoding the burst address 'B1B0'. The decoded signal thus activated is supplied to the decoder 140 with address bit signals Bn–B2, which are outputted from the address buffer 110 in synchronization with the first clock $\phi 1$. Then a signal Xi/Yi decoded by the decoder is used to select a word line or bit lines in either one of bank BANK1 and BANK2.

In a case where the random access memory device performs a burst operation of the DDR mode, two of the four decoded signals D3–D0 are simultaneously activated. The decoded signals thus activated are Supplied to the decoder 140 with the address bit signals Bn–B2. The decoder 140 selects a word line or bit lines of the bank BANK1 in response to one of the two activated and decoded signals and the address bit signals Bn–B2. At the same time, the decoder 140 selects a word line and bit lines of a bank BANK2 in response to the other of the two activated and decoded signals and the address bit signals Bn–B2. The operation associated with this will be more fully described below.

As described above, when the burst-type SRAM device operates at the SDR mode, a word line (or bit lines) in either one of the banks BANK1 and BANK2 is activated by the address buffer 110, the address generator 120, the pre-decoder 130 and the decoder 140. After this, data of a byte/word/double word unit is read according to the well-known manner, and then the data is outputted in one cycle of the system clock. Successively, the data of the byte/word/double word unit is sequentially read depending on a sequence of burst addresses, which are generated according to a sequential burst mode or an interleaved burst mode.

On the other hand, when the burst-type SRAM device operates at the DDR mode, a word line (or bit lines) in each of the banks BANK1 and BANK2 is activated the address buffer 110, the address generator 120, the pre-decoder 130 and the decoder 140. Then, data of the byte/word/double word unit that is stored in each of the banks BANK1 and BANK2 is simultaneously read by the well-known read manner. The data read from the bank BANK1 is outputted to the exterior during a first logic state or a second logic state of the system clock, and the data read from the bank BANK2 is outputted to the exterior during the second logic state or the first logic state of the system clock. Successively, the data of the byte/word/double word unit is sequentially read depending on a sequence of burst addresses, which are generated according to the sequential burst mode or the interleaved burst mode.

Thus, the address generating and decoding circuit 100 of the present invention generates a sequence of burst addresses required for the SDR mode and the DDR mode, and then decodes the burst addresses.

Figure 2:
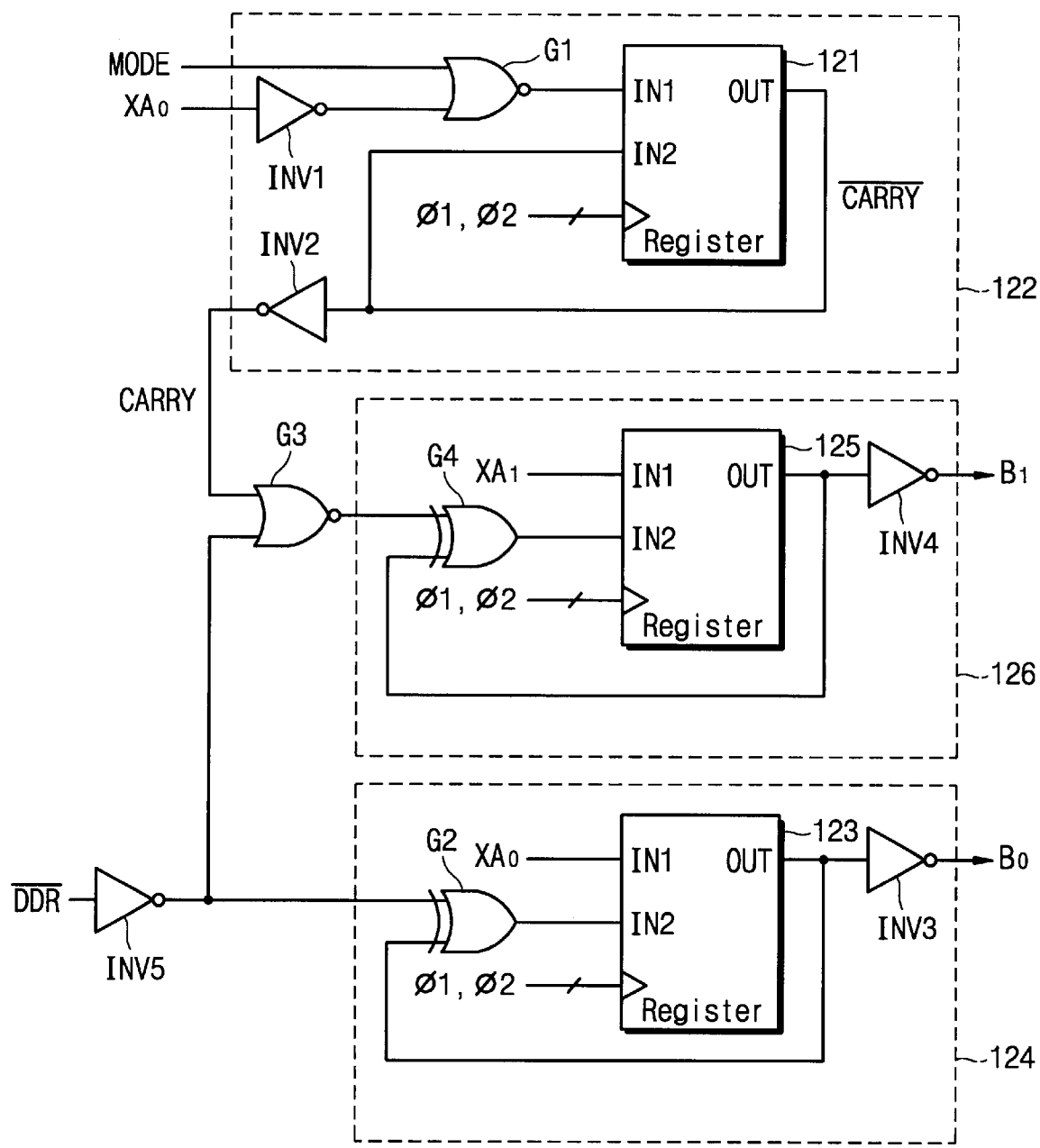
FIG. 2 is a preferred embodiment of an address generator illustrated in FIG. 1.

FIG. 2 is a preferred embodiment of an address generator illustrated in FIG. 1. The address generator 120 in FIG. 2 is composed of a carry generating part 122, a lower burst address generating part 124, a upper burst address generating part 126, an inverter INV5 and a NOR gate G3.

The carry generating part 122 is driven by the first and second clocks $\phi 1$ and $\phi 2$, and receives a lower address bit signal XA0 of an initial address bit signals XA0 and XA1 to generate a carry signal CARRY according to the control signal MODE, which indicates the sequential burst mode or the interleaved burst mode. The carry generating part 122 is composed of a register 121, two inverters INV1 and INV2 and a NOR gate G1. The register 121 is driven by the clock signals $\phi 1$ and $\phi 2$, and has a first input IN1 connected to the output of the NOR gate G1 and a second input IN2 directly connected to its output OUT. The NOR gate G1 has a first input for receiving the control signal MODE and a second input for receiving the lower address bit signal XA0 via the inverter INV1. The inverter INV2 connected to the output OUT of the register 121 outputs an output signal of the carry generating part 122, that is, the carry signal CARRY.

Figure 3:
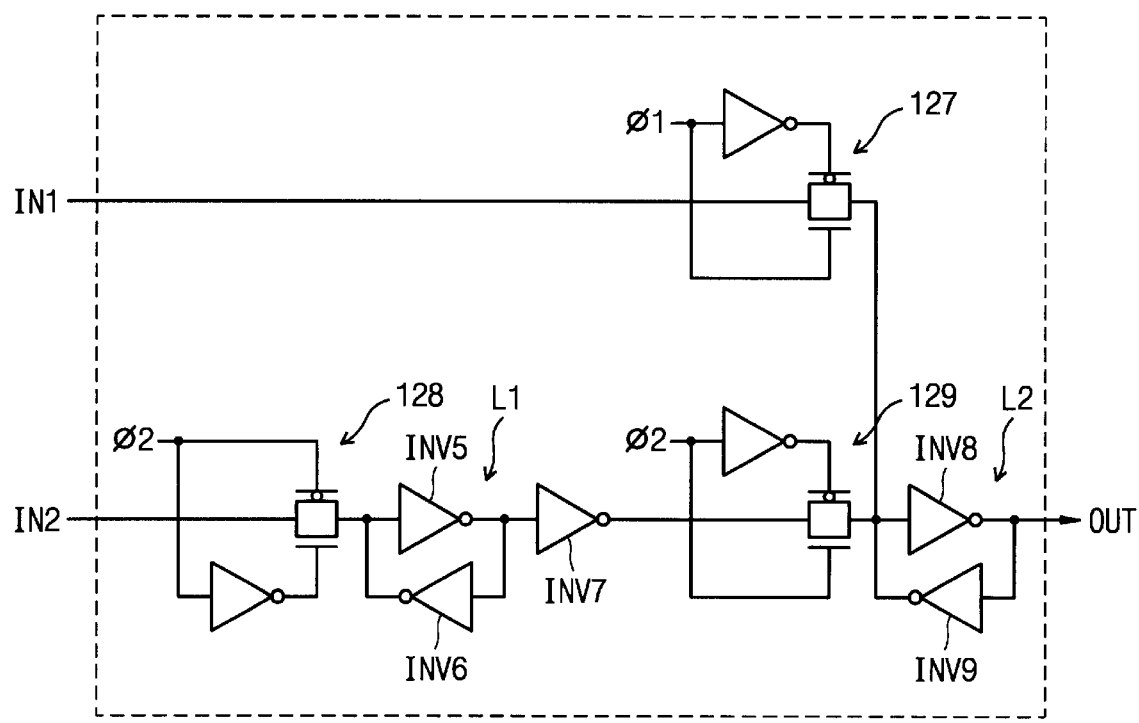
FIG. 3 is a preferred embodiment of a register illustrated in FIG. 2.

Referring to FIG. 3 that shows a detailed circuit of the register 121, the register 121 consists of three transmission gates 127, 128 and 129, and five inverters INV5–INV9. Each of the transmission gates 127, 128 and 129 consists of a PMOS transistor, an NMOS transistor and an inverter connected as illustrated in FIG. 3. The inverters INV5 and INV6, and the inverters INV8 and INV9 constitute latch circuits L1 and L2, respectively. Inverter INV7 is coupled after latch circuit L2, and is also known as the seventh inverter.

When the clock signal $\phi 1$ transitions from a logic low level to a logic high level, a signal IN1 inputted through the first input is transferred to the latch circuit L2 via the transmission gate 127. When the clock signal $\phi 2$ is maintained at a logic low level, a signal IN2 inputted via the second input is transferred to the latch circuit L1 via the transmission gate 128. Then, when the clock signal $\phi 2$ transitions from a logic low level to a logic high level, the signal held by the latch circuit L1 (a signal at an input terminal of the inverter INV5) is transferred to the latch circuit L2 through the inverters INV5 and INV7 and the transmission gate 129.

Figure 7:
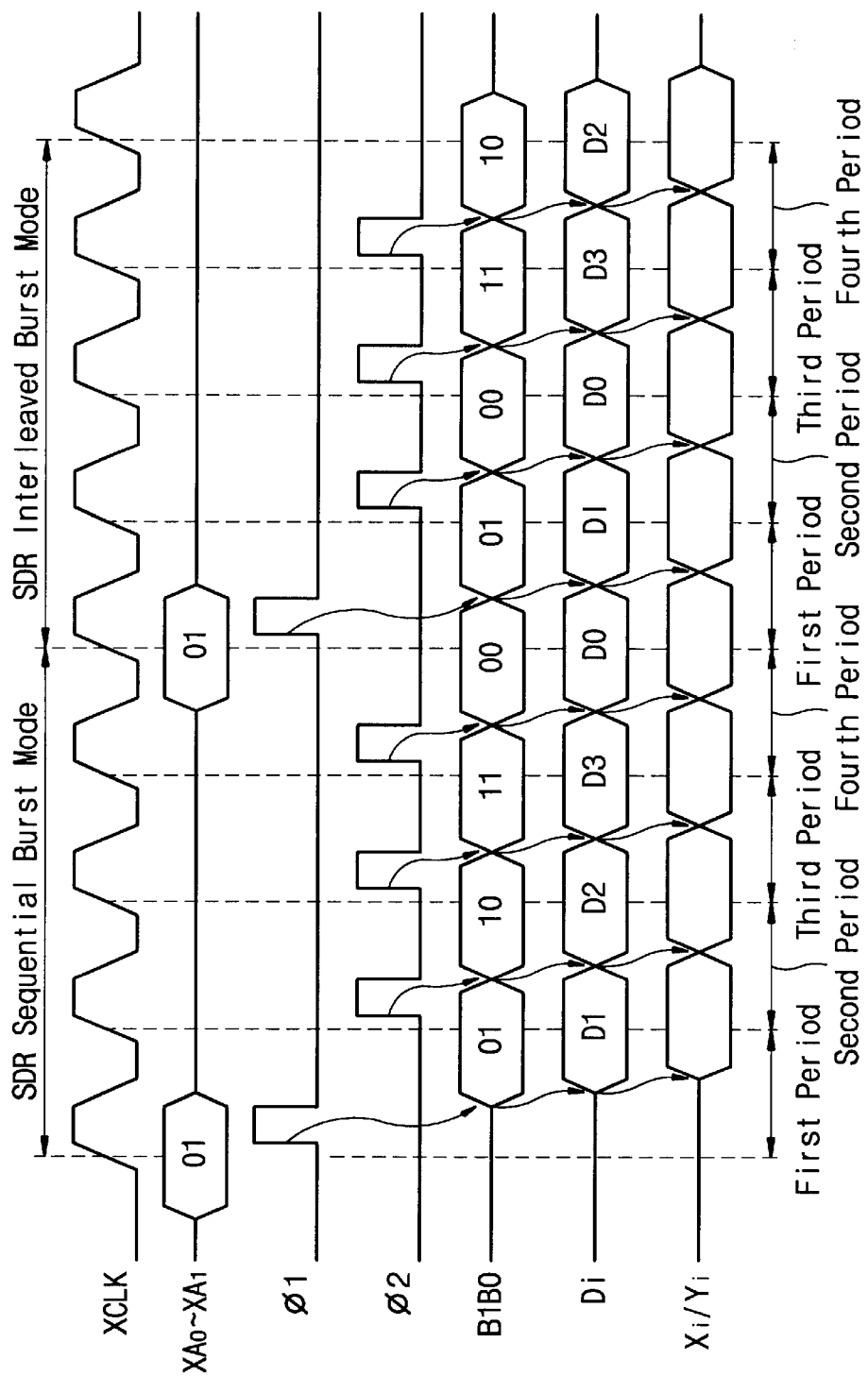
FIG. 7 is a timing diagram for describing a single data rate mode according to the present invention.

The carry generating part 122 illustrated in FIG. 2 outputs the lower address bit signal XA0 as the carry signal CARRY at a low-to-high transition of the first clock signal φ1 in the sequential burst mode (as seen in FIG. 7, at a first period of the burst mode). During the interleaved burst mode, the carry generating part 122 sets the carry signal CARRY to logically '0' at a low-to-high transition of the clock signal φ1 regardless of a logic state of the lower address bit signal XA0. And the carry generating part 122 inverts a signal CARRY outputted at a previous period whenever the second clock signal φ2 transitions from a logic low level to a logic high level (as seen in FIG. 7, in a second period, a third period and a fourth period of the burst mode), and outputs the inverted signal as the carry signal CARRY.

Returning to FIG. 2, the lower burst address generating part 124 is driven by the first and second clock signals φ1 and φ2, and receives the lower address bit signal XA0 to generate a lower burst address bit signal B0 according to the control signal $\overline{DDR}$. The lower burst address generating part 124 consists of a register 123, an inverter INV3 and an exclusive OR gate G2, also known as XOR gate G2. The register 123 is driven by the first and second clock signals φ1 and φ2, and has a first input terminal IN1 receiving the lower address bit signal XA0 and a second input terminal IN2 connected to an output terminal of the XOR gate G2. The XOR gate G2 has a first input terminal receiving the control signal $\overline{DDR}$ via the inverter INV5 (i.e., an inverted version of the control signal $\overline{DDR}$), and a second input terminal connected to the output terminal OUT of the register 123. The inverter INV3 is connected to the output terminal OUT of the register 123, and outputs the lower burst address bit signal B0. The register 123 of the lower burst address generating part 124 is constructed the same as the register 121 of the carry generating part 121 illustrated in FIG. 3.

In the lower burst address generating part 124 having the above-mentioned circuit configuration, the lower address bit signal XA0 is outputted as a lower burst address bit signal B0 even though its logic state is varied in a first period of a burst mode regardless of the SDR/DDR mode (refer to FIG. 7, at a low-to-high transition of the first clock signal φ1). After this, the lower burst address generating part 124 inverts a signal outputted in a previous period every low-to-high transition of the second clock φ2 in the SDR mode, and then outputs an inverted version of the signal as the lower burst address bit signal B0. On the other hand, in the DDR mode, the lower burst address generating part 124 outputs a signal, which is outputted in a previous period, as the lower burst address bit signal B0 directly. That is, the lower burst address generating part 124 functions as a latch circuit.

The NOR gate G3 illustrated in FIG. 2 combines an inverted version of the control signal $\overline{DDR}$ via the inverter INV5 and an output signal, that is, the carry signal CARRY, of the carry generating part 122. The NOR gate G3 constitutes a carry signal inverting part. In particular, when the SRAM device operates in the SDR mode, that is, the control signal $\overline{DDR}$ is at a logic high level, an output of the NOR gate G3 is determined according to a logic state of the carry signal CARRY. And, when the SRAM device operates in the DDR mode (or the control signal $\overline{DDR}$ is at a logic low level), the output of the NOR gate G3 is set to a logic low level regardless of a logic state of the carry signal CARRY.

Continuing to refer to FIG. 2, the upper burst address generating part 126 is driven by the first and second clock signals φ1 and φ2, and receives a upper address bit signal XA1 of the initial address bit signals XA1–XA0 to generate a upper burst address bit signal B1 according to the output signal of the NOR gate G3. The upper burst address generating part 126 consists of a register 126, an inverter INV4 and a XOR gate G4. The register 125 is driven by the first and second clock signals φ1 and φ2, and has a first input terminal IN1 receiving the upper address bit signal XA1 and a second input terminal IN2 connected to an output terminal of the XOR gate G4. The XOR gate G4 has a first input terminal connected to an output terminal of the NOR gate G3 and a second input terminal connected to the output terminal OUT of the register 125. The register 125 of the upper burst address generating part 126 is configured identically to that of the lower burst address generating part 124 illustrated in FIG. 3.

When the memory device operates in the DDR mode, the upper burst address generating part 126 operates identically to the lower burst address generating part 124 functioning as a latch circuit, because the output of the NOR gate G3 is fixed to a logic low level regardless of a logic state of the carry signal CARRY. The upper address generating part 126 operates as follows according to an output signal of the NOR gate G3 in the SDR mode. When the output signal of the NOR gate G3 is a logic low level, the upper burst address generating part 126 operates the same as the lower burst address generating part 124 operates in the SDR mode. That is, in the SDR mode, the upper burst address generating part 126 inverts a signal outputted in a previous period every low-to-high transition of the second clock signal φ2, and then outputs an inverted version of the signal as the upper burst address bit signal B1. On the other hand, when the output signal of the NOR gate G3 is a logic high level, the upper burst address generating part 126 operates the same as the lower burst address generating part 124 operates in the DDR mode. That is, in the DDR mode, the upper burst address generating part 126 outputs a signal outputted in a previous period whenever the second clock signal φ2 transitions from a logic low level to a logic high level, as the upper burst address bit signal B0 directly. That is, the upper burst address generating part 126 functions as a latch circuit.

Figure 8:
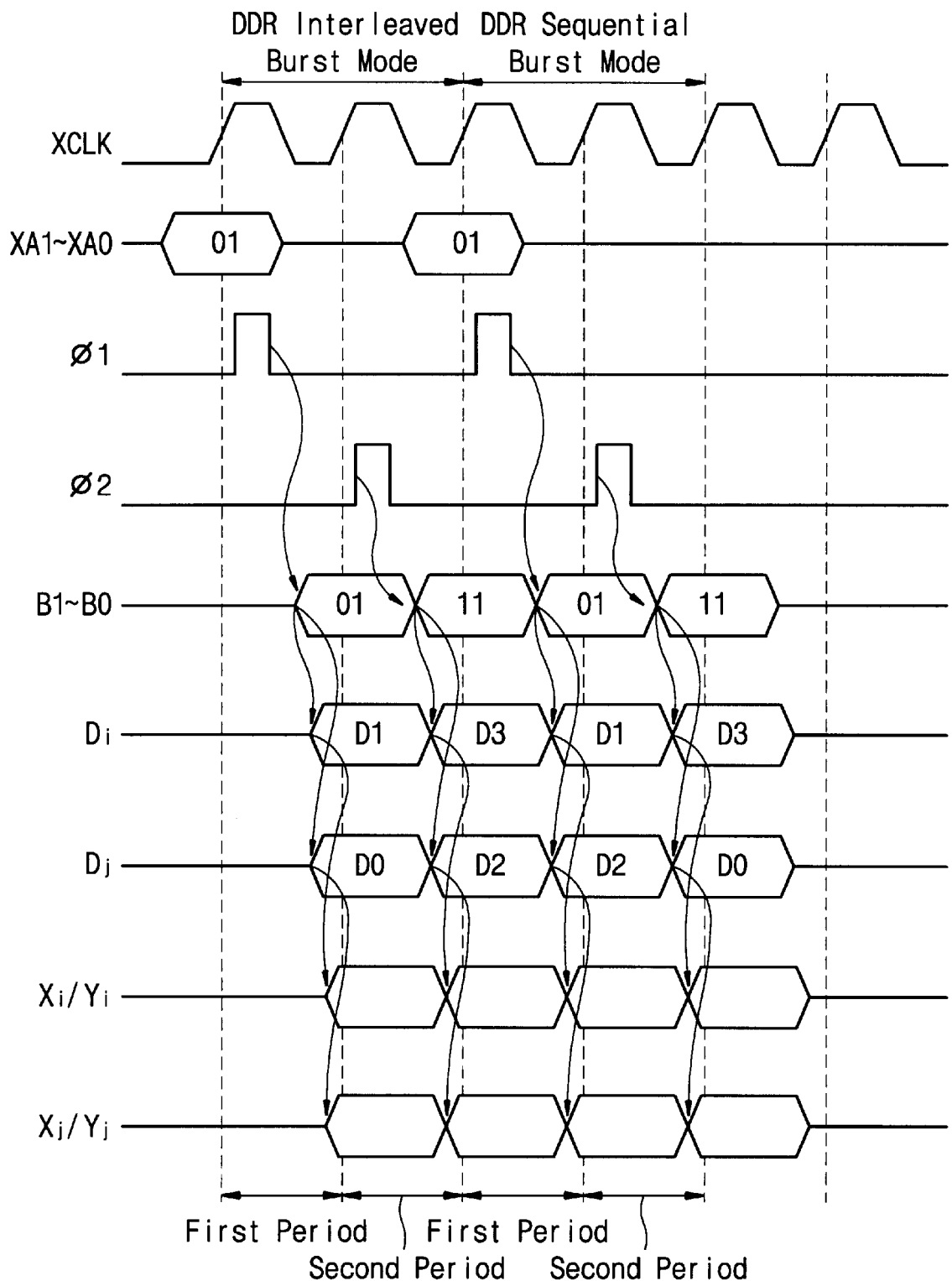
FIG. 8 is a timing diagram for describing a double data rate mode according to the present invention.

As mentioned above, assume that the burst-type SRAM device of the present invention performs a 4-burst operation. Under this assumption, the first and second clock signals φ1 and φ2 repeat a four-period cycle in the SDR mode (as seen in FIG. 7). At this time, the first clock signal φ1 has its pulse in a first period, and the second clock signal φ2 has its pulse in a second period, a third period and a fourth period, respectively. On the other hand, when the SRAM device operates in the DDR mode, the first and second clock signals φ1 and φ2 repeat a two-period cycle (as seen in FIG. 8). At this time, the first clock signal φ1 has its pulse in a first period, and the second clock signal φ2 has its pulse in a second period.

Figure 4:
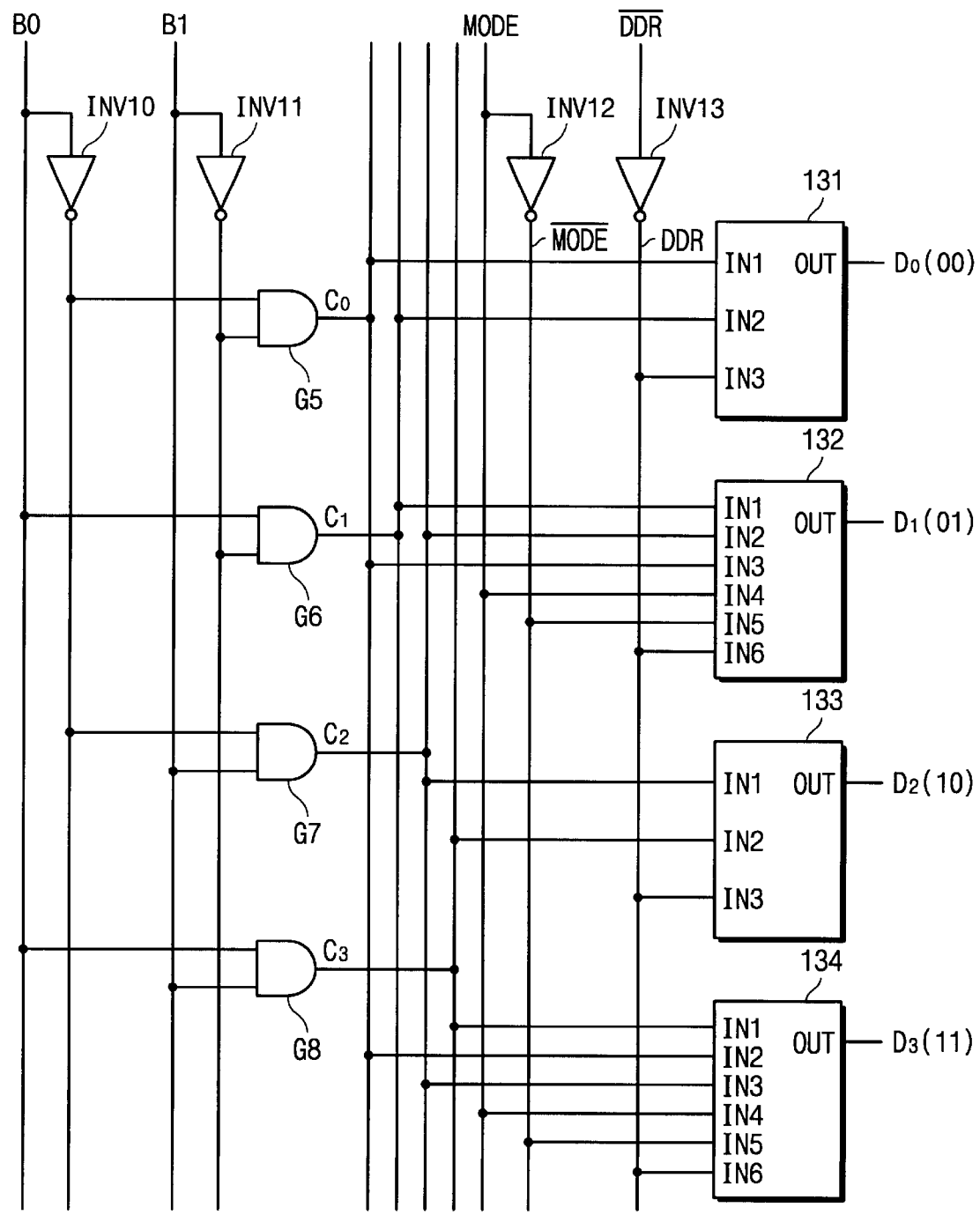
FIG. 4 is a preferred embodiment of a pre-decoder illustrated in FIG. 1.

FIG. 4 shows a preferred embodiment of a pre-decoder 130 shown in FIG. 1.

Referring to FIG. 4, the pre-decoder 130 of the present invention receives a burst address 'B1B0' generated at the address generator illustrated in FIG. 1, and decodes the received burst address 'B1B0' according to an interleaved/sequential burst operation of the SDR or DDR mode. The pre-decoder 130 consists of four inverters INV10–INV13, four AND gates G5–G8 and four combination circuits 131–134 connected as illustrated in FIG. 4.

Figure 5:
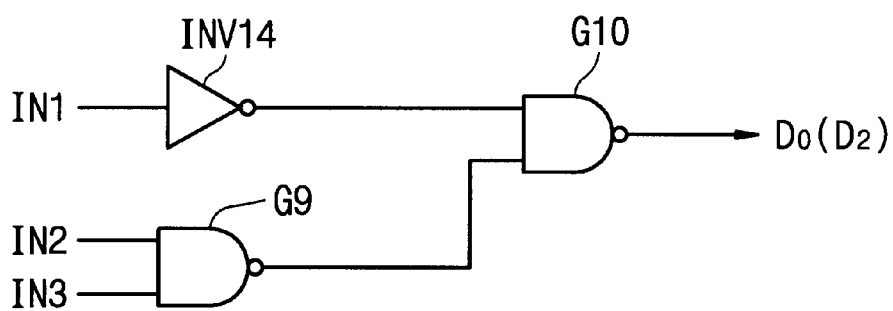
FIG. 5 is a preferred embodiment of a first combination circuit illustrated in FIG. 4.

A preferred embodiment of a first combination circuit 131 in FIG. 4 is illustrated in FIG. 5. Referring to FIG. 5, the first combination circuit 131 consists of three input terminals IN1, IN2 and IN3, an output terminal D0, an inverter INV14 and two NAND gates G9 and G10. The inverter INV14 inverts a signal C0 applied to the input terminal IN1, and the inverted signal is transferred to an input terminal of the NAND gate G10 which has an output terminal for outputting a signal D0. The NAND gate G9 has input terminals each receiving signals C1 and $\overline{DDR}$ applied via the input terminals IN2 and IN3, and an output terminal connected to the other input terminal of the NAND gate G1.

A third combination circuit 133 in FIG. 4 has the same configuration as the first combination circuit 131. However, a first input terminal IN1 of the first combination circuit 131 is connected to an output C0 of the AND gate G5, and a first input terminal IN1 of the third combination circuit 133 is connected to an output C2 of the AND gate G7. And, a second input terminal IN2 of the first combination circuit 131 is connected to an output C1 of the AND gate G6, and a second input terminal IN2 of the third combination circuit 133 is connected to an output C3 of the AND gate G8.

Figure 6:
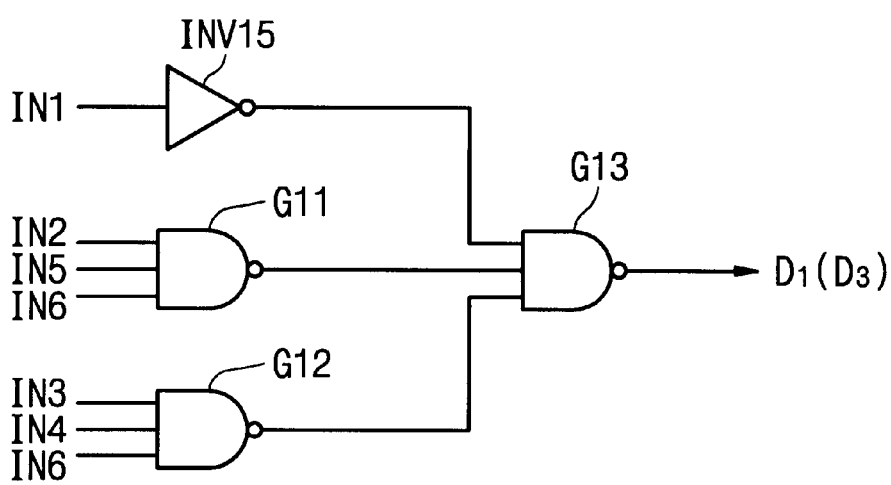
FIG. 6 is a preferred embodiment of a second combination circuit illustrated in FIG. 4.

Referring to FIG. 6, a preferred embodiment of a second combination circuit 132 in FIG. 4 is illustrated. The second combination circuit 132 consists of six input terminals IN1–IN6, an output terminal OUT, an inverter INV15 and three NAND gates G11, G12 and G13 connected as illustrated in FIG. 6. A fourth combination circuit 134 in FIG. 4 has the same configuration as the second combination circuit 132 in FIG. 6. However, a first input terminal IN1 of the second combination circuit 132 is connected to an output C1 of the AND gate G6, and a first input terminal IN1 of the fourth combination circuit 134 is connected to an output G3 of the AND gate G5. A second input terminal IN2 of the second combination circuit 132 is connected to an output C2 of the AND gate G7, and a second input terminal IN2 of the fourth combination circuit 134 is connected to an output C0 of the AND gate G5. And, a third input terminal IN3 of the second combination circuit 132 is connected to an output C0 of the AND gate G5, and a third input terminal IN3 of the fourth combination circuit 134 is connected to an output C2 of the AND gate G7.

Assume that the burst-type SRAM device performs an interleaved burst operation of the SDR mode. Under this condition, the pre-decoder 130 decodes a burst address 'B1B0' generated at the address generator 120 to activate one of decoded signals D0–D3 at a logic high level and to inactivate remaining decoded signals at a logic low level. For example, when the burst address 'B1B0' is '01', an output C1 of the AND gate G6 becomes high, and outputs of other AND gates G5, G7 and G8 become low. Since the SRAM device performs an interleaved burst operation of the SDR mode, the control signal MODE is high and the control signal $\overline{DDR}$ is high. According to the above-mentioned condition, output signals D0, D2 and D3 of the first, third and fourth combination circuits 131, 133 and 134 become low, respectively, and an output signal D1 of the second combination circuit 132 becomes high.

Assume that the burst-type SRAM device performs an interleaved burst operation of the DDR mode. Under this condition, the pre-decoder 130 decodes a burst address 'B1B0' generated from the address generator 120 to activate two ones of decoded signals D0–D3 at a logic high level and to inactivate the others at a logic low level. For example, when the burst address 'B1B0' is '01', an output signal C1 of the AND gate G6 becomes high, and output signals C0, C2 and C3 of other AND gates G5, G7 and G8 become low. Since the SRAM device performs the interleaved burst operation of the DDR mode, the control signal MODE is at a logic high level, and the control signal $\overline{DDR}$ is at a logic low level. According to the above-described condition, the output signals D2 and D3 of the third and fourth combination circuits 133 and 134 become low, respectively, and the output signals D0 and D1 of the first and second combination circuits 131 and 132 become high, respectively.

Hereinafter, the operation of the address generating and decoding circuit according to the present invention will be described with reference to accompanying drawings. FIG. 7 is a timing diagram for describing an operation of the address generating and decoding circuit according to the burst operation of a single data rate (SDR) mode, and FIG. 8 is a timing diagram for describing an operation of the address generating and decoding circuit according to the burst operation of the double data rate (DDR) mode.

FIGS. 9A–9D shows tables of logic states of a set of burst addresses and decoding signals necessary at sequential and interleaved burst operations of the SDR/DDR mode. More particularly, FIG. 9A shows SDR interleaved burst addresses, FIG. 9B shows SDR sequential burst addresses, FIG. 9C shows logic states of decoding signals according to DDR interleaved and sequential burst modes, and FIG. 9D shows logic states of the control signals according to each operation mode are as follows.

When the control signal $\overline{DDR}$ is at a logic high level the burst-type SRAM device operates in the SDR mode, and when the control signal $\overline{DDR}$ is at a logic low level the burst-type SRAM device operates in the DDR mode. And, when the control signal MODE is at a logic low level, the SRAM device enters the sequential burst mode. When the control signal MODE is at a logic high level, the SRAM device enters the interleaved burst mode. That is, the address generating and decoding circuit used in the burst-type SRAM device of the present invention generates burst addresses necessary for four burst operation modes, respectively.

SDR Sequential Burst Mode

Assume that the burst-type SRAM device operates in the SDR sequential burst mode. Under this condition, the control signal MODE has a logic low level, and the control signal $\overline{DDR}$ has a logic high level. When a system clock XCLK transitions from a low level to a high level, an external address XAn–XA0 is provided to the SRAM device. At this time, an initial address 'XA1XA0' of the external address has one of '00', '01', '10' and '11'. Assuming that the initial address 'XA1XA0' is '01', the operation of the address generating and decoding circuit with regard to the SDR sequential burst mode will be described.

First as illustrated in FIG. 7, when the clock signal φ1 transitions from a logic low level to a logic high level in a first period, the carry generating part 122, the lower burst address generating part 124 and the upper burst address generating part 126 output corresponding inputs as corresponding output signals CARRY, B0 and B1 regardless of a variation of a logic state.

In particular, in the carry generating part 122, since the control signal MODE is low and the lower address bit signal XA0 is high, an output signal of the NOR gate G1, that is, a first input signal IN1 of the register 121 becomes high. When the clock signal φ1 has a low-to-high transition, the input signal IN1 of logic low level is transferred to the latch circuit L2 through the transmission gate 127. That is, the carry signal CARRY becomes high through the inverters INV8 and INV2.

At a low-to-high transition of the clock signal φ1, the lower burst address generating part 124 outputs the lower address bit signal XA0 of logically '1' through the transmission gate 127 and the inverters INV8 and INV3 as the lower burst address bit signal B0. Similarly, the upper burst address generating part 126 outputs the upper address bit signal XA1 of logically '0' as the upper burst address bit signal B1. Therefore, in a first period of the SDR sequential burst mode, the externally provided initial address 'XA1XA0' of '01' is directly output as the burst address 'B1B0'. That is, the burst address 'B1B0' of the first period is '01'.

The burst address 'B1B0' of '01' thus generated is provided to the pre-decoder 130. As described above, the pre-decoder 130 responds to the burst address 'B1B0' of '01', the control signal MODE of a logic low level and the control signal $\overline{DDR}$ of a logic high level to activate one (e.g., D1) of decoded signals D0–D3 at a logic high level. After this, the decoder 140 responds to remaining address bit signals Bn–B2 outputted from the address buffer 110 and the activated decoded signal D1 by the pre-decoder 130 to activate a word line (or bit lines) of either one of the banks BANK1 and BANK2.

Before the clock signal φ2 has a low-to-high transition, that is, while the first and second clock signals φ1 and φ2 are maintained at a logic low level in the first period, a signal OUT of a logic low level, which is outputted from the register 121 of the carry generating part 122, is transferred to the latch circuit L1 through its second input terminal IN2 and the transmission gate 128. And a signal OUT of a logic low level, which is outputted from the lower burst address generating part 124, is transferred to one input terminal of the XOR gate G2. At this time, since the control signal $\overline{DDR}$ is high, an output signal of the XOR gate G2 goes low, and the output signal of a logic low level is transferred to a latch circuit L1 of the register 123 through the transmission gate 128. Similarly, a signal OUT of a logic high level, which is outputted from the upper address generating part 126, is transferred to one input terminal of the XOR gate G4. At this time, since the carry signal CARRY is high and the control signal $\overline{DDR}$ is high, an output signal of the NOR gate G3 becomes low. Therefore, a signal of a logic low level is latched in the latch circuit L1.

Then, in a second period of the SDR sequential burst mode, as illustrated in FIG. 7, the clock signal φ1 is maintain low, while the clock signal φ2 has a low-to-high transition. The signal of the logic low level, which is maintained in the latch circuit L1 of the register 121, is transferred to the latch circuit L2 through the inverters INV5 and INV7 and the transmission gate 129, the signal of a logic low level maintained in the latch circuit L1 of the register 123 is transferred to the latch circuit L2 through the inverters INV5 and INV7 and the transmission gate 129, and the signal of a logic high level held in the latch circuit L1 of the register 125 is transferred to the latch circuit L2 through the inverters INV5 and INV7 and the transmission gate 129. As a result, the carry signal CARRY, the lower burst address bit signal B0 and the upper burst address bit signal B1 goes low, low and high, respectively. That is, the burst address 'B1B0' of '10' is generated in the second period of the SDR sequential burst mode.

The burst address 'B1B0' of '10' thus generated is provided to the pre-decoder 130, and the pre-decoder 130 responds to the burst address 'B1B0' of '10', the control signal MODE of a logic low level and the control signal $\overline{DDR}$ of a logic high level to then activate one D2 of decoded signals D0–D3 at a logic high level. After this, the decoder 140 responds to remaining address bit signals Bn–B2 from the address buffer 110 and the decoded signal D2 activated by the pre-decoder 130, and then activates a word line or bit lines in either one of the banks BANK1 and BANK2.

Before the clock signal φ2 has a low-to-high transition in a third period next to the second period, that is, while the first and second clock signals φ1 and φ2 are maintained low in the second period, a signal OUT of a logic high level outputted from the register 121 of the carry generating part 122 is transferred to the latch circuit L1 through a second input terminal IN2 of the register 121 and the transmission gate 128. And a signal OUT of a logic high level outputted from the lower burst address generating part 124 is transferred to one input terminal of the XOR gate G2. At this time, since the control signal $\overline{DDR}$ is high, an output of the XOR gate G2 goes high, and it is transferred to the latch circuit L1 of the register 123 through the transmission gate 128. Similarly, a signal OUT of a logic low level from the register 125 of the upper burst address generating part 126 is transferred to one input terminal of the XOR gate G4. At this time, since the carry signal CARRY is low and the control signal $\overline{DDR}$ is high, an output signal of the NOR gate G3 goes high. Therefore, a signal of a logic high level is latched in the latch circuit L1 of the register 125.

Then, in the third period of the SDR sequential burst mode, as illustrated in FIG. 7, the clock signal φ1 is maintained low, while the clock signal φ2 transitions from a logic low level to a logic high level. Thus, a signal of a logic high level held in the latch L1 of the register 121 is transferred to the latch L2 through the inverters INV5 and INV7 and the transmission gate 129, a signal of a logic high level held in the latch L1 of the register 123 is transferred to the latch L2 through the inverters INV5 and INV7 and the transmission gate 129, and a signal of a logic high level held in the latch L1 of the register 125 is transferred to the latch L2 through the inverters INV5 and INV7 and the transmission gate 129. As a result, the carry signal CARRY, the lower burst address bit signal B0 and the upper burst address bit signal B1 go high. That is, the burst address 'B1B0' of '11', is generated in the third period of the SDR sequential burst mode, as illustrated in FIG. 7.

Similarly to the previous period, the burst address 'B1B0' of '11' is provided to the pre-decoder 130. The pre-decoder 130 responds to the burst address 'B1B0' of '11', the control signal MODE of a logic low level and the control signal of a logic high level, to thus activate signal D3 of decoded signals D0–D3. After this, the decoder 140 responds to remaining address bit signals Bn–B2 and the decoded signal D3 activated by the pre-decoder 130 to activate a word line or bit lines of a bank BANK1 or BANK2.

Before the clock signal φ2 has a low-to-high transition in a fourth period, that is, while the first and second clock signals φ1 and φ2 are maintained low in the third period, a signal OUT of a logic low level from the register 121 of the carry generating part 122 is transferred to the latch L1 through a second input terminal IN2 of the register 121 and a transmission gate 128. And a signal OUT of a logic low level from the register 123 of the lower burst address generating part 124 is transferred to one input terminal of the XOR gate G2. At this time, since the control signal is a logic high level, an output signal of XOR gate G2 goes low, and then is transferred to the latch L1 of the register 123 through a transmission gate 128. Similarly, since the carry signal CARRY is high and the control signal $\overline{DDR}$ is high, an output signal of the NOR gate G3 goes low. Therefore, a signal of a logic low level is latched in the latch L1 of the register 125.

Then, in the fourth period of the SDR sequential burst mode, the clock signal φ1 is maintained low, while the clock signal φ2 has a low-to-high transition. Thus, a signal of a logic low level held in the latch L1 of the register 121 is transferred to the latch L2 through the inverters INV5 and INV7 and the transmission gate 129, a signal of a logic low level held in the latch L1 of the register 123 is transferred to the latch L2 through the inverters INV5 and INV7 and the transmission gate 129, and a signal of a logic low level held in the latch L1 of the register 125 is transferred to the latch L2 through the inverters INV5 and INV7 and the transmission gate 129. As a result, the carry signal CARRY, the lower burst address bit signal B0 and the upper burst address bit signal B1 all go low. That is, the burst address 'B1B0' of '00' is generated in the fourth period of the SDR sequential burst mode, as illustrated in FIG. 7. The burst address 'B1B0' of '00' thus generated is provided to the predecoder 130. The pre-decoder 130 responds to the burst address 'B1B0' of '00', the control signal MODE of a logic low level and the control signal $\overline{DDR}$ of a logic high level to then activate one D0 of decoded signals D0–D3 at a logic high level.

As described above, if the initial address 'XA1XA0' of '01' is provided from the exterior, the address generator 120 of the present invention sequentially generates a sequence of 2 internal burst addresses 'B1B0': '01', '10', '11' and 00'. Furthermore, since a burst address generated by the address generator 120 is directly transferred to the pre-decoder 130 when the clock signal φ1 or φ2 transitions from a logic low level to a logic high level, an overall decoding speed is improved. Similarly, the address generating and decoding operation according to an SDR interleaved burst mode is performed identically or similarly to the above-described SDR sequential burst mode, and the description thereof is thus omitted.

DDR Interleaved Burst Mode

The burst-type SRAM device operates a DDR interleaved burst mode, the operation of the address generating and decoding circuit according to the present invention will be more fully described with reference to the accompanying drawings. As illustrated in the above-described FIG. 9D, in the DDR burst interleaved burst mode, the control signal indicating a sequential burst mode or an interleaved burst mode goes high, and the control signal indicating the SDR mode or the DDR mode goes low. Assume that an initial address 'XA1XA0' of '01' is provided from the exterior.

First, as illustrated in FIG. 8, when the clock signal φ1 transitions from a logic low level to a logic high level in a first period, the carry generating part 122, the lower burst address generating part 124 and the upper burst address generating part 126 output corresponding input signals as corresponding output signals CARRY, B0 and B1 without a variation of a logic state.

In particular, in the carry generating part 122, since the control signal MODE is high and the lower address bit signal XA0 is high, an output signal of the NOR gate G1 goes low. Therefore, the carry signal of a logic low level is outputted from the carry generating part 122 through the latch L1 and the inverter INV2. Similarly, the lower and upper burst address generating parts 124 and 126 output the lower burst address bit signal B0 of logically '1' and the upper burst address bit signal B1 of logically '0', respectively. The burst address 'B1B0' of '01' generated from the address generator 120 is transferred to the pre-decoder 130 when the clock signal φ1 transitions from a logic low level to a logic high level (that is, a first period of the DDR interleaved burst mode).

The burst address 'B1B0' of '01' thus generated is decoded by the pre-decoder 130 in FIG. 4 according to the control signals MODE and $\overline{DDR}$, so that decoded signals D0 and D1 are activated high. The decoder 140 responds to the decoded signals D0 and D1 and address bit signals Bn–B2 from the address buffer 110 to select a word line (or bit lines) of the respective banks BANK1 and BANK2 at the same time. After this, data is read from the respective banks BANK1 and BANK2 according to the well-known read manner. One of the two read data is outputted in a first logic state period of the external clock signal XCLK, and the other thereof is outputted in a second logic state period of the external clock signal XCLK.

Before the clock signal φ2 has a low-to-high transition in the second period, that is, while the clock signals φ1 and φ2 are maintained low in the first period, signals provided to second input terminals IN2 of the respective registers 121, 123 and 125 are latched in corresponding latches L1 of the registers 121, 123 and 125 in the carry generating par 122, the lower burst address generating part 124 and the upper burst address generating part 126, respectively.

In particular, since an output terminal OUT of the register 121 is directly connected to its second input terminal, a signal of a logic high level generated in the first period is directly transferred to the second input terminal IN2. Therefore, the input signal IN2 of a logic high level is latched in the latch L1 through a transmission gate of the register 121. In the lower burst address generating part 124, a signal OUT of a logic low level generated in the first period is transferred to one input terminal of the XOR gate G2. At this time, since the control signal is at a logic low level, an output signal of the XOR gate goes high, and then is transferred to the latch L1 through the transmission gate 128 of the register 123.

While the clock signals φ1 and φ2 are maintained low in the first period of the DDR interleaved burst mode, differently from the SDR sequential/interleaved burst mode, an output signal of the XOR gate G2 is always set low regardless of a logic state of the carry signal CARRY because the control signal $\overline{DDR}$ is at a logic low level. In this condition, since the output signal OUT of the register 125 is high, the second input terminal IN2 of the register 125 goes high. Therefore, a signal of a logic high level is latched in the latch L1 of the register 125.

Then, in a second period of the DDR interleaved burst mode, the clock signal φ1 is maintained low, while the clock signal φ2 has a low-to-high transition, as illustrated in FIG. 8. Thus, a signal of a logic high level held in the latch L1 of the register 121 is transferred to the latch L2 through the inverters INV5 and INV7 and the transmission gate 129, a signal of a logic high level held in the latch L1 of the register 123 is transferred to the latch L2 through the inverters INV5 and INV7 and the transmission gate 129, and a signal of a logic high level held in the latch L1 of the register 125 is transferred to the latch L2 through the inverters INV5 and INV7 and the transmission gate 129. As a result, signals CARRY, B0 and B1 go high. That is, the burst address 'B1B0' of '11' is generated in the second period of the DDR interleaved burst mode, as illustrated in FIG. 8.

The burst address 'B1B0' of '11' thus generated is decoded by the pre-decoder 130 in FIG. 4 according to logic states of the control signals MODE and $\overline{DDR}$, so that two decoded signals D2 and D3 are simultaneously activated high. The decoder 140 responds to the activated signals D2 and D3 and address bit signals Bn–B2 from the address buffer 110 to select a word line (or bit lines) of each of the banks BANK1 and BANK2. After this, data is read out from the banks BANK1 and BANK2 according to the well-known read manner. One of the two read data is outputted in a first logic state period of the clock XCLK, and the other thereof is outputted in a second state period of the clock XCLK.

The address generating and decoding operation according to the DDR sequential burst mode is performed identically/ similarly to the above-mentioned DDR interleaved burst mode, and description thereof is thus omitted. In the address generating and decoding circuit realized to the burst-type SRAM device, burst address bit signals and decoded signals have a static state. However, it is obvious to use signals of a pulse type in the address generating and decoding circuit.

The invention has been described using exemplary preferred embodiments. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. An address generating and decoding circuit for use in a burst-type random access memory device having both a single data rate (SDR) mode and a double data rate (DDR) mode, the circuit comprising:

an address generator for producing a sequence of burst addresses in response to an initial address being a part of an externally applied address, a first control signal indicative of a burst type, and a second control signal indicative of either the DDR mode or the SDR mode, wherein the first burst addresses of the sequence are synchronized with first and second clock signals; and decoding means for sequentially receiving the burst addresses to decode a first one of the burst addresses thus received and the remaining address of the externally applied address.

2. The circuit of claim 1, further comprising:

an address buffer for receiving the remaining address of the externally applied address to provide the decoding means with the remaining address in synchronization with the first clock signal.

3. The circuit of claim 2, wherein the decoding means includes:

a pre-decoder for receiving the inputted burst address to decode the inputted burst address in response to the first and second control signals, and a decoder for decoding the decoded signals outputted from the pre-decoder and the remaining address.

4. The circuit of claim 3, wherein the random access memory device has at least two banks, and the pre-decoder activates one of the decoded signals while in the SDR mode, to select one of the two banks.

5. The circuit of claim 3, wherein the random access memory device has at least two banks, and the pre-decoder activates two of the decoded signals while in the DDR mode concurrently, to select both the banks.

6. The circuit of claim 1, wherein the burst-type random access memory device comprises a burst-type static random access memory device having a 4-burst mode, and the address generator is adapted to receiving an initial two-bit address.

7. The circuit of claim 6, wherein the burst addresses from the address generator are transferred to the pre-decoder when either one of the first clock signal and the second clock signal makes a low-to-high transition.

8. The circuit of claim 7, wherein the first clock signal and the second clock signal repeat a two-period cycle during the DDR mode, the first and the second clock signal having one pulse in a first and in a second period, respectively; and the first clock signal and the second clock signal repeat a four-period cycle during the SDR mode, the first clock signal having only one pulse in a first period, and the second clock signal having pulses in each of a second, a third and a fourth period.

9. The circuit of claim 1, wherein the address generator comprises:

a carry generating part driven by the first and the second clock signals, for receiving a lower address bit of the initial address to generate a carry signal in accordance with the first control signal;

a carry signal inverting part for receiving the carry signal to invert the received carry signal during the SDR mode, and to set its output signal at a logic low level during the DDR node;

a lower burst address generating part driven by the first and the second clock signals, for receiving the lower address bit to generate a lower burst address bit of a first burst address in accordance with the second control signal; and an upper burst address generating part driven by the first and the second clock signals, for receiving an upper address bit of the initial address to generate a upper burst address bit of the first burst address in accordance with a logic state of the output signal from the carry signal inverting part.

10. The circuit of claim 9, wherein the carry signal inverting part includes a NOR gate which has:

a first input receiving the carry signal, a second input receiving an inverted version of the second control signal, and an output coupled to the upper burst address generating part.

11. The circuit of claim 9, wherein each of the lower burst address generating part, the upper burst address generating part and the carry generating part transfers its input signal as its output signal at a low-to-high transition of the first clock signal.

12. The circuit of claim 9, wherein the lower burst address generating part inverts a signal outputted at a previous period to output the inverted signal as the lower burst address bit at a low-to-high transition of the second clock signal during the SDR mode, and latches a signal outputted at a previous period to output the latched signal as the lower burst address bit at the low-to-high transition of the second clock signal during the DDR mode.

13. The circuit of claim 9, wherein the lower burst address generating part includes:

a register driven by the first and the second clock signal, and has a first input receiving the lower address bit, a second input, and an output, an inverter coupled to the output of the register, and outputs the lower burst address bit, and a XOR gate which has a first input receiving the inverse signal of the second control signal, a second input coupled to the output of the register, and an output coupled to the second input of the register.

14. The circuit of claim 13, wherein the register includes:

a first transmission gate for transferring its first input in response to the low-to-high transition of the first clock signal, a second transmission gate for transferring its second input in response to a high-to-low transition of the second clock signal, a first latch for latching a signal transferred through the first transmission gate, a second latch for latching a signal transferred through the second transmission gate, a seventh inverter coupled after the transmission gate, and a third transmission gate which transfers a signal from the second latch through the seventh inverter to the first latch in response to the low-to-high transition of the second clock signal.

15. The circuit of claim 11, wherein the carry generating part sets the carry signal at a logic low level when the first clock signal transitions from a logic low level to a logic high level during an interleaved burst mode, and transfers the lower address bit as the carry signal during a sequential burst mode, and the carry generating part inverts a signal outputted at a previous period to output the inverted signal as the carry signal at a low-to-high transition of the second clock signal under the sequential burst mode and the interleaved burst mode.

16. The circuit of claim 15, wherein the carry generating part includes:

a register driven by the first and the second clock signal and has a first and a second input, and an output coupled to the second input of the register, a NOR gate which has a first input receiving the first control signal, a second input receiving the lower address bit through a first inverter, and an output coupled to the first input of the register, and a second inverter coupled to the output of the register and outputs the carry signal.

17. The circuit of claim 16, wherein the register includes:

a first transmission gate for transferring its first input in response to the low-to-high transition of the first clock signal, a second transmission gate for transferring its second input in response to a high-to-low transition of the second clock signal, a first latch for latching a signal transferred through the first transmission gate, a second latch for latching a signal transferred through the second transmission gate, a seventh inverter coupled after the transmission gate, and a third transmission gate which transfers a signal from the second latch through the seventh inverter to the first latch in response to the low-to-high transition of the second clock signal.

18. The circuit of claim 11, wherein the upper burst address generating part inverts a signal outputted at a previous period when an output signal from the carry signal inverting part is at a logic low level and the device operates at the SDR mode, to output the inverted signal as the upper burst address bit at a low-to-high transition of the second clock signal, and the upper burst address generating part latches a signal outputted at a previous period when an output signal from the carry signal inverting part is at a logic high level and the device operates under the DDR mode, to output the latched signal as the upper burst address bit at a low-to-high transition of the second clock signal.

19. The circuit of claim 18, wherein the upper burst address generating part includes:

a register driven by the first and the second clock signal and has a first input receiving the upper address bit, a second input, and an output, an inverter coupled to the output of the register and outputs the upper burst address bit, and a XOR gate which has a first input receiving the output signal of the carry signal inverting part, a second input coupled to the output of the register, and an output coupled to the second input of the register.

20. The circuit of claim 19, wherein the register includes:

a first transmission gate for transferring its first input in response to the low-to-high transition of the first clock signal, a second transmission gate for transferring its second input in response to a high-to-low transition of the second clock signal, a first latch for latching a signal transferred through the first transmission gate, a second latch for latching a signal transferred through the second transmission gate, a seventh inverter coupled after the transmission gate, and a third transmission gate which transfers a signal from the second latch through the seventh inverter to the first latch in response to the low-to-high transition of the second clock signal.

21. An address generating and decoding circuit for use in a burst-type random access memory device having both a single data rate (SDR) mode and a double data rate (DDR) mode, the circuit comprising:

first and second banks, each storing data;

an address generator for producing a sequence of burst addresses in response to initial address bit of an externally applied multi-bit address, a first control signal indicative of a burst of a burst type, and a second control signal indicative of either the DDR mode or the SDR mode, wherein the burst addresses of the sequence are synchronised with first and second clock signals;

a pre-decoder for receiving a burst address outputted from the address generator to decode the inputted burst address in response to the first and second control signals, the pre-decoder outputting decoded signals as the decoding result; and a decoder responsive to the decoded signals and the remaining address of the multi-bit address, for selecting one of the first and second banks during the SDR mode and the first and second banks concurrently during the DDR mode.

22. The circuit of claim 11, wherein the pre-decoder activates two of the decoded signals at the DDR mode, so that the first and second banks are simultaneously selected by the decoder, and only one of the decoded signals at the SDR mode, so that one of the first and second banks is selected by the decoder.

23. The circuit of claim 22, wherein the address generator includes:

a carry generating part driven by the first and the second clock signal, for receiving a lower address bit of the initial address bits to generate a carry signal in accordance with the first control signal, a carry signal inverting part for receiving the carry signal to invert the received carry signal as its output signal during the SDR mode, and to set output signal at a logic low level during the DDR mode, a lower burst address generating part driven by the first and the second clock signal, for receiving the lower address bit to generate a lower burst address bit of a first burst address in accordance with the second control signal, and a upper burst address generating part driven by the first and the second clock signal, for receiving a upper address bit of the initial address bits to generate a upper burst address bit of the first burst address in accordance with the output signal from the carry signal inverting part.

24. The circuit of claim 23, wherein the carry signal inverting part includes a NOR gate which has:

a first input receiving the carry signal, a second input receiving an inverse signal of the second control signal, and an output coupled to the upper burst address generating part.

25. The circuit of claim 23, wherein the lower burst address generating part includes:

a register driven by the first and the second clock signal and has a first input receiving the lower address bit, a second input, and an output, an inverter coupled to the output of the register and outputs the lower burst address bit, and a XOR gate which has a first input receiving an inverse signal of the second control signal, a second input coupled to the output of the register, and an output coupled to the second input of the register.

26. The circuit of claim 25, wherein the register includes:

a first transmission gate for transferring its first input in response to the low-to-high transition of the first clock signal, a second transmission gate for transferring its second input in response to a high-to-low transition of the second clock signal, a first latch for latching a signal transferred through the first transmission gate, a second latch for latching a signal transferred through the second transmission gate, a seventh inverter coupled after the transmission gate, and a third transmission gate which transfers a signal from the second latch through the seventh inverter to the first latch in response to the low-to-high transition of the second clock signal.

27. The circuit of claim 23, wherein the carry generating part includes:

a register driven by the first and the second clock signal and has a first and a second input, and an output coupled to the second input of the register, a NOR gate which has a first input receiving the first control signal, a second input receiving the lower address bit through a first inverter, and an output coupled to the first input of the register, and a second inverter coupled to the output of the register and outputs the carry signal.

28. The circuit of claim 27, wherein the register includes:

a first transmission gate for transferring its first input in response to the low-to-high transition of the first clock signal, a second transmission gate for transferring its second input in response to a high-to-low transition of the second clock signal, a first latch for latching a signal transferred through the first transmission gate, a second latch for latching a signal transferred through the second transmission gate, a seventh inverter coupled after the transmission gate, and a third transmission gate which transfers a signal from the second latch through the seventh inverter to the first latch in response to the low-to-high transition of the second clock signal.

29. The circuit of claim 23, wherein the upper burst address generating part includes:

a register driven by the first and the second clock signal and has a first input receiving the upper address bit, a second input, and an output, an inverter coupled to the output of the register and outputs the upper burst address bit, and a XOR gate which has a first input receiving an output signal of the carry signal inverting part, a second input coupled to the output of the register, and an output coupled to the second input of the register.

30. The circuit of claim 29, wherein the register includes:

a first transmission gate for transferring its first input in response to the low-to-high transition of the first clock signal, a second transmission gate for transferring its second input in response to a high-to-low transition of the second clock signal, a first latch for latching a signal transferred through the first transmission gate, a second latch for latching a signal transferred through the second transmission gate, a seventh inverter coupled after the transmission gate, and a third transmission gate which transfers a signal from the second latch through the seventh inverter to the first latch in response to the low-to-high transition of the second clock signal.

* * * * *

UNITED STATES PATENT AND TRADEMARK OFFICE
CERTIFICATE OF CORRECTION

PATENT NO. : 6,356,504 B1
DATED : March 12, 2002
INVENTOR(S) : Kim

It is certified that error appears in the above-identified patent and that said Letters Patent is hereby corrected as shown below:

Column 1,
Line 63, "clement" should read -- element --.

Column 3,
Line 54, "are Supplied" should read -- are supplied --.

Column 7,
Line 10, "G1" should read -- G10 --.
Line 32, "G5" should read -- G8 --.

Column 11,
Line 21, "00'" should read -- '00' --.

Signed and Sealed this

Twenty-ninth Day of October, 2002

Attest:

Attesting Officer

JAMES E. ROGAN
Director of the United States Patent and Trademark Office